United States Patent [19]

Olcese et al.

[11] 4,125,136
[45] Nov. 14, 1978

[54] CUT AND CLINCH MECHANISM

[75] Inventors: Luis A. Olcese, Hawthorne; Joseph E. Roesch, Cerritos, both of Calif.

[73] Assignee: Xerox Corporation, Stamford, Conn.

[21] Appl. No.: 816,620

[22] Filed: Jul. 18, 1977

[51] Int. Cl.² ............................................. B21F 11/00
[52] U.S. Cl. ................................. 140/105; 140/93 D; 83/198; 29/741
[58] Field of Search ............... 140/1, 93 D, 93 F, 105; 29/741; 83/196, 198, 200

[56] References Cited

U.S. PATENT DOCUMENTS

| | | | |
|---|---|---|---|
| 3,062,245 | 11/1962 | Liebscher | 140/1 |
| 3,141,492 | 7/1964 | Petree et al. | 29/741 |
| 3,857,420 | 12/1974 | Newman | 140/1 |

*Primary Examiner*—Lowell A. Larson
*Attorney, Agent, or Firm*—James J. Ralabate; Michael J. Colitz, Jr.; Franklyn C. Weiss

[57] ABSTRACT

Electrical component leads, extending through apertures of a printed circuit board, are cut and clinched by reciprocating cutter blocks moved transverse to the axis of the leads. All the leads are cut with selected ones being bent to a greater extent than the remainder of the leads.

6 Claims, 9 Drawing Figures

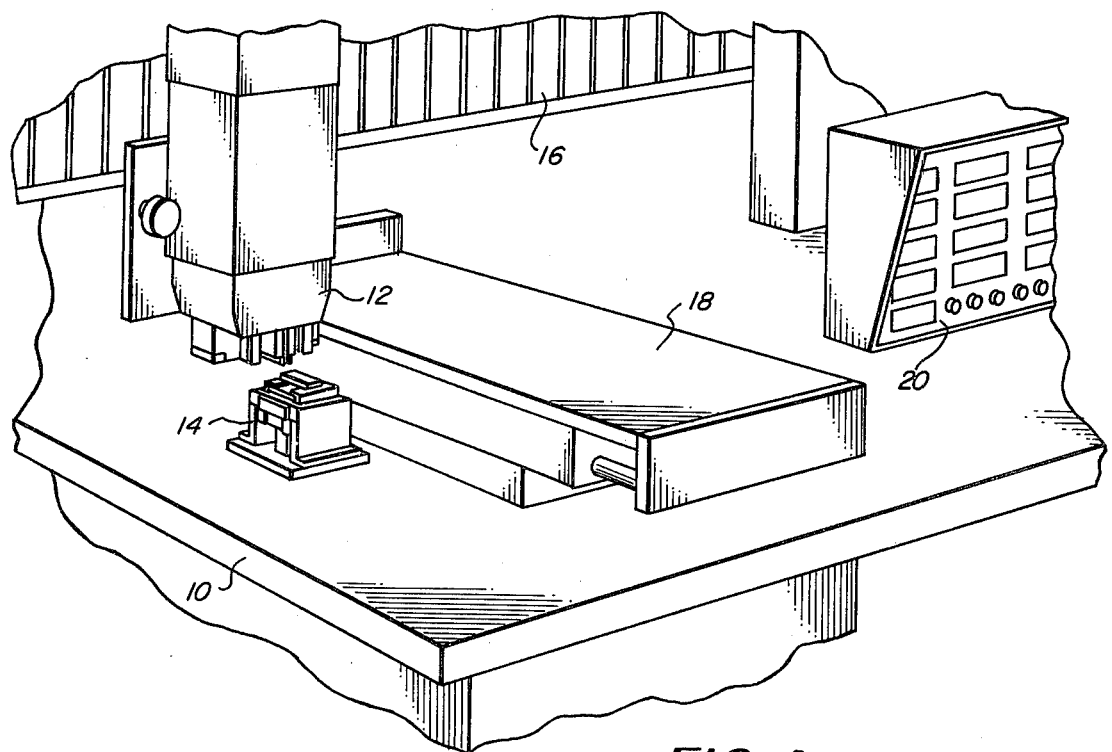
FIG. 1
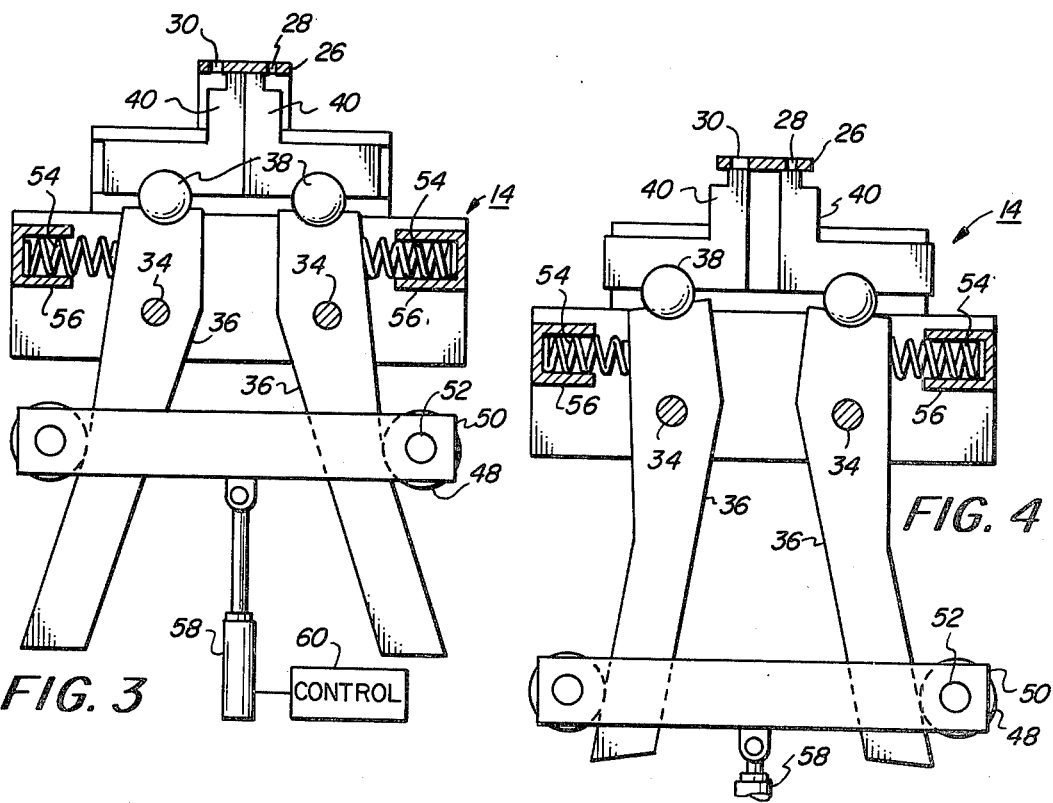
FIG. 3
FIG. 4

CUT AND CLINCH MECHANISM

BACKGROUND OF THE INVENTION

In the art of cutting and clinching leads of electrical components projecting through holes in a printed circuit board, it is desirable to provide apparatus which will quickly and easily cut the leads to predetermined lengths. In doing so, all of the leads are normally biased outwardly in opposing directions with preselected leads being bent to greater extents than the remainder of the leads. This helps secure the electrical components to the printed circuit board. The bending of leads in this manner provides a convenient and improved way of attaching the electrical components to the boards to permit handling during subsequent assembly operations prior to a final soldering operation.

A prior art approach to the instant problem is described in U.S. Pat. No 3,414,024 to Anderson et al where rotary, rather than reciprocal, cut and clinch members are employed. Other related prior art apparatus are disclosed in various patents, where clinching and/or cutting may occur before or after insertion of the electrical element into the printed circuit board, including U.S. Pat. No. 3,396,758 to Hall; 3,515,175 to Hudson and 3,519,033 to Peppin.

SUMMARY OF THE INVENTION

In accordance with the instant invention, a pair of reciprocal cutter blocks are movable in a horizontal plane toward and away from each other. They are located immediately beneath a shear plate having apertures which substantially align with the apertures in a printed circuit board. The aligned apertures are adapted to receive the leads of the electrical component to be attached to the board. The blocks are coupled to downwardly extending rocker arms, pivotal about shafts, whereby the movement of opposed rollers down the rocker arms will cause the block to move outwardly against the action of a spring to cut and bend the leads in the desired manner. Preselected apertures in the shear plate are enlarged to permit a greater outward bend to preselected leads for greater adherence of the electrical component to the printed circuit board.

OBJECTS OF THE INVENTION

It is therefore an object of the present invention to cut or trim the ends of leads of an electrical component which are extending through a printed circuit board.

It is also an object of the present invention to clinch or bend preselected leads of an electrical component which are extending through a printed circuit board.

It is also an object of the present invention to cut and bent the leads of an electrical component which are extending through a printed circuit board with preselected leads being bent to a greater degree to assure a tighter clinch so that the electrical component is maintained secure to the board as for subsequent assembly operations prior to permanent affixation as through a wave soldering.

These and other objects of the present invention will become apparent when the following detailed description of the invention is read in conjunction with the appended claims and accompanying drawings.

BRIEF DESCRIPTION OF THE DRAWINGS

FIG. 1 is a perspective view of a printed circuit board component insertion machine in which the instant invention may be employed.

FIGS. 3 and 4 are sectional views of the cut and clinch mechanism with further mechanisms shown and taken along line 3-3 of FIG. 2.

DETAILED DESCRIPTION OF THE PREFERRED EMBODIMENT

Figure 2:
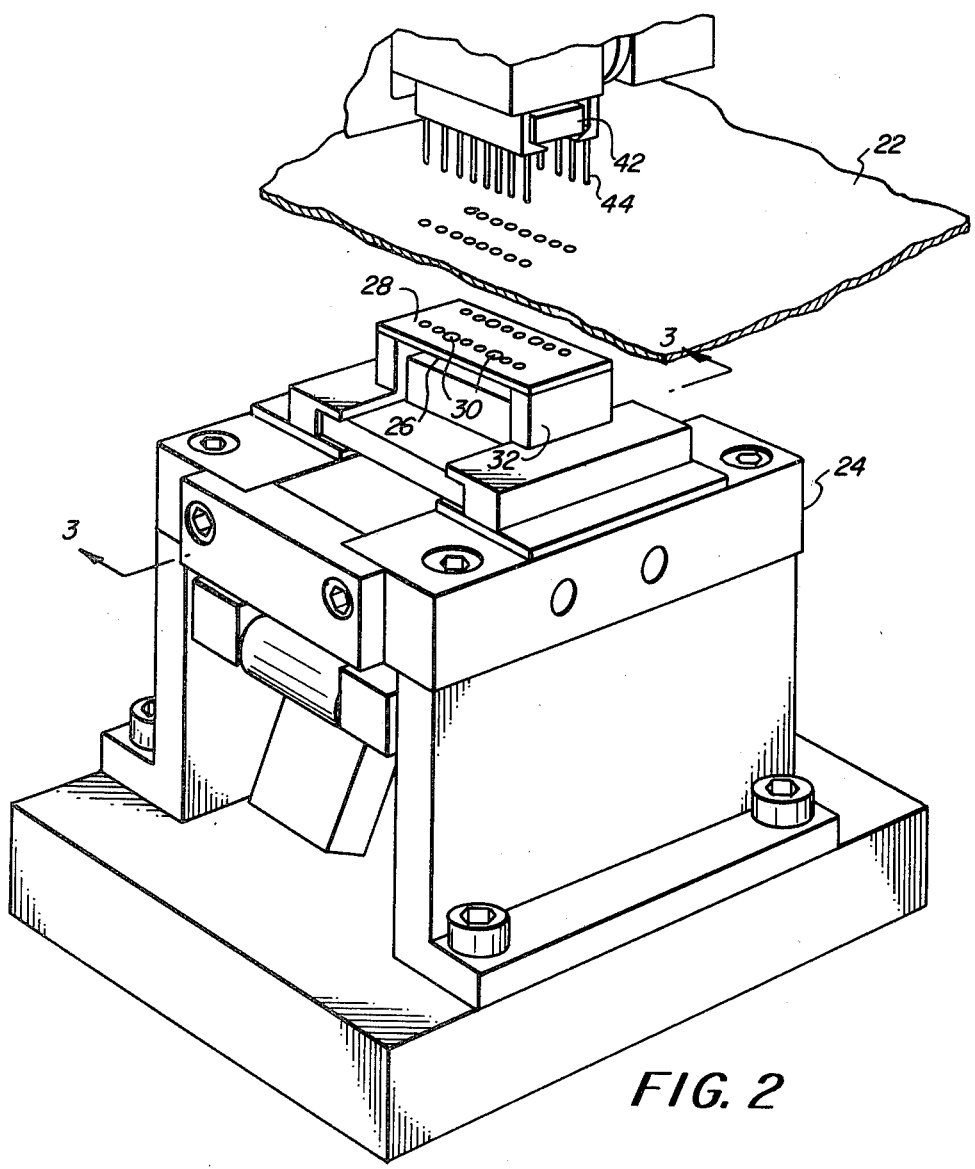
FIG. 2 is a perspective view similar to FIG. 1 but showing in more detail the cut and clinch mechanism of the instant invention in relation to the insertion, head, electrical component, its leads and the printed circuit board.
Figure 5:
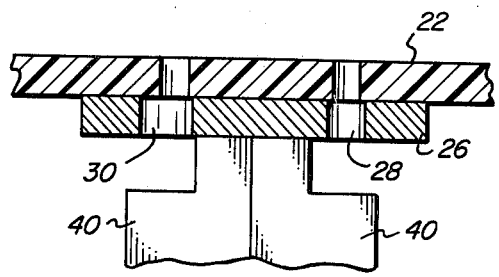
FIGS. 5-9 are enlarged views partly in cross-section of successive stages in the operation of the apparatus showing an electrical component with its leads inserted through a printed circuit board and with the projecting leads being sequentially cut and clinched by the operation of the shear blocks functioning with the shear plate and with FIG. 9 showing a modified shear plate.
Figure 6:
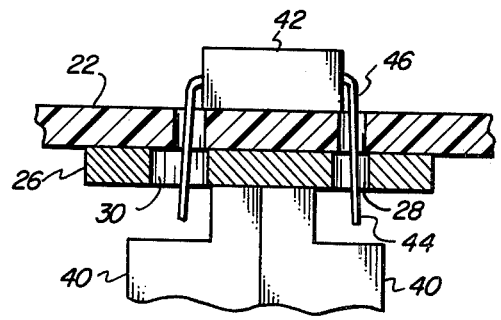

Shown in FIG. 1 is a printed circuit board component insertion machine employing the cut and clinch mechanism of the present invention. Mounted upon the general support structure 10 is an insertion head 12, cut and clinch assembly 14, magazine carriage 16, X-Y positioning table 18 and a control panel 20 supporting and directing the necessary elements and circuitry to effect a coordinated operation of the machine.

The insertion head 12, consists of appropriate channels to feed preselected electrical elements to and into a printed circuit board 22 in a preprogrammed fashion. The cut and clinch assembly 14, like the insertion head 12, is mounted on an elevator for movement toward and away from the printed circuit board to be assembled, i.e. to be provided with one or more electrical components. This cut and clinch unit will be described in greater detail hereinafter. The magazine carriage 16 consists of a slide and an appropriate number of channels with appropriate passages to guide any preselected electrical component to the insertion head.

The X-Y positioning table 18 is located for movement in a plane between the insertion head 12 and the cut and clinch assembly 14 for movement in all directions in the horizontal plane in which it is located. It is adapted to receive the printed circuit board 22 and to locate it in an appropriate orientation with respect to the insertion head and cut and clinch assembly for ensuring the mounting of the electrical component into the appropriate holes of the printed circuit board.

The necessary switches, controls and indicators to start, stop, mode select, and indicate status are located in the control panel 20. The control panel can cause the functioning of the machine in a variety of modes from manual to fully automatic. Computerized logic is utilized for the selection of the appropriate electrical components to be provided into the appropriate parts of the printed circuit board. The machine is controlled by a computer. Channel selection, table positioning and all stops in an insertion cycle are controlled when in the automatic or stop mode.

As seen more clearly in FIGS. 2-8, during operation, the cut and clinch assembly is located immediately beneath the printed circuit board with the insertion head immediately thereabove with all three in alignment. The cut and clinch assembly includes appropriate support subassembly 24 supporting a shear plate 26 having apertures substantially corresponding in number and location to the largest number of leads on an electrical component to be inserted therethrough. The shear plate is located on the side of printed circuit board remote from the electrical element to be cut and clinched. The apertures 28 are preferably vertical through the shear plate with a preselected number of apertures 30, as near four corners thereof, being of an enlarged diameter. The differences in diameters are done to give guidance to the leads at these preselected locations so that the subsequent outward bend and cut may provide longer leads with greater outward angles for greater holding stability of the leads located through the enlarged apertures as will be described in greater detail hereinafter.

The shear plate 26 is supported by side brackets 32 on support subassembly 24. The support subassembly also supports a pair of pivot rods 34 therebeneath. The rods 34 pivotally support rocker arms 36 for movement. The upper surfaces of the rocker arms are provided with spherical detents for locating free floating bearing balls 38. Located between the rocker arms 36 and shear plate 26 are the reciprocating shear blocks 40 on the side of the shear plate remote from the printed circuit board. Each shear block is provided with a spherical detent on its lower surface for locating the upper surfaces of the free floating bearing balls 38. As can be readily understood, concurrent reciprocation of the rocker arms 36 will concurrently reciprocate the shear blocks 40 in a horizontal plane toward and away from each other in such fashion that, on their outward movement, they will contact, bend, then cut the electrical leads extending through the printed circuit boards and the shear plates. The clinching action takes place by the action of the upper outer edge of each shear block in association with the lower outer edge of each aperture in the printed circuit board. The cutting action takes place by the action of the outer edge of each shear block in association with the lower outer edge of each aperture in shear plate. This relationship is clearly seen in the sequential steps illustrated by FIGS. 6–8. Also illustrated by these Figures is the relationship of the lengths and diameters of the apertures of both the printed circuit board and the shear plate which combine to provide the predetermined angles and lengths of the cut and clinched leads.

Figure 7:
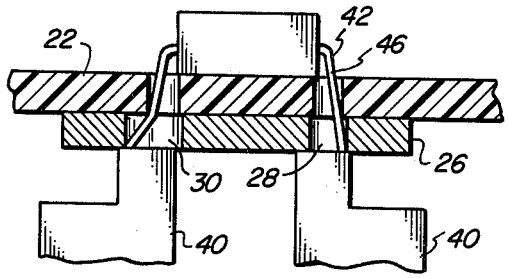
Figure 8:
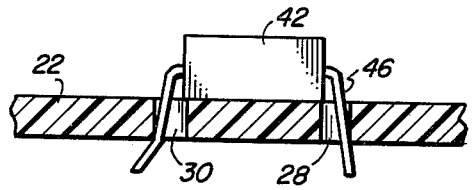
Figure 9:
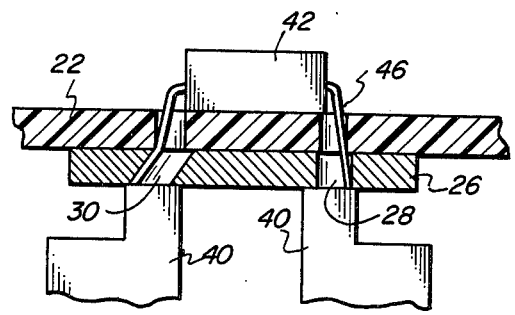

Enlarged apertures may also take the form of those shown in the alternate embodiment of FIG. 9 which is analogous to FIG. 7. In the FIG. 9 embodiment the enlarged apertures of the shear plate 26 are angled outwardly so that the lower outer edge is in the same relative location as the lower outer edge of the enlarged apertures of the primary embodiment. As a result the same cut and clinch relationship is attained.

In normal operation, each electrical component 42 has its parallel rows of leads 44 inwardly sprung by an insertion head which normally applies pressure to hold leads at parallelisms as they are inserted through the parallel rows of apertures in the printed circuit board and shear plate. These leads maintain the resilience to move outwardly to slightly beyond their prior 15° angle when the leads and printed circuit board are removed from their relationship with the shear plate. The slightly increased angle is created by the action of the shear blocks outwardly bending the leads at their upper ends adjacent the electrical element body at 46. Added firmness is provided between the unsoldered leads and printed circuit boards by virtue of the enlarged apertures 30 in the shear plate. These enlarged apertures are located to correspond at or near the four corners of the leads of the electrical element being coupled to the printed circiut board. The leads extending through the enlarged holes are forced beyond the normal 15° bend by the shear block moving the lead in the enlarged aperture so that the lead is bent around the printed circuit board.

As can be more clearly seen in FIG. 7, these preseleted leads are bent at a central point along their lengths to the more outwardly direction, nearly 30° from the vertical, and at a greater length represented by the greater length of the enlarged holes in the shear plate. In this fashion, a total bend and cut is such that the bent leads will be clinched against the printed circuit board so as to hold the electrical component to the printed circuit board during subsequent assembly operations prior to being subjected to a final wave soldering process or other permanent bonding. Without the extended bend applying an added clinch to preselected leads, the unsoldered electrical component would only be marginally secured to the printed circuit board and create an undesirable situation wherein the electrical components could be jarred loose from the printed circuit board through normal handling.

Movement is provided to the shear blocks 40 by means of a pair of parallel rollers 48 mounted to contact the external faces of the rocker arms 36. The rollers are mounted in a yoke 50, on bearing rods 52, for concurrent movement down the rocker arm. This downward movement will pivot the rocker arms 36 to provide an outward cutting and clinching movement of the shear blocks 40 as they move past the apertures of the printed circuit board and shear plate with the leads mounted in interference relationship therewith. Spring elements 54 are located in guide supports 56. The guide supports are mounted in turn on opposite faces of the upper portions of the support subassembly 24 and tend to bias the upper ends of the rocker arms 36 to a central rest position of FIGS. 3, 5 and 6. In this rest position, the shear blocks 40 are positioned within the opposed lines of leads to be clinched and cut. Movement of the yoke and rollers downwardly, against the tension of the spring, is effected by virtue of a piston cylinder 58 which is actuated by a control mechanism, 60, part of the control logic of the machine. A scrap receiving tray may be located beneath the cut and clinch assembly for collecting the ends of the leads being trimmed or cut. Alternately, a suitable vacuum system may be employed.

All of the functioning elements of the cut and clinch assembly are made of a hard, wear resistant tool steel to provide for smoothness of operation and cleanness of cuts in generating the board with the cut and clinched printed circuit board elements secured thereon. Further hardening or harder inserts may also be provided at the surfaces where cutting actually occurs.

It is to be understood that the above-described apparatus is simply illustrative of one embodiment of the invention which may be usable to cut and clinch leads associated with electrical components onto printed circuit boards.

While the instant invention is being described as a specific embodiment, it is not intended to be so limited but it is intended to be protected broadly within the spirit and scope of the appended claims.

We claim:

1. In a device for bending and cutting leads projecting through an article, an apertured shear plate adapted to receive the leads to be bent and cut;

shear blocks mounted on one side of the shear plate in sliding relation thereto;

means for biasing said shear blocks to a rest position, and means to provide motion to the shear blocks away from each other and parallel to the shear plate to bend and cut the leads there adjacent.

2. The apparatus as set forth in claim 1 wherein a preselected number of apertures in the shear plate are enlarged with respect to the remaining apertures to provide a greater bend in the leads extending therethrough.

3. The apparatus as set forth in claim 1 wherein a preselected number of apertures in the shear plate are angled with respect to the remaining apertures to provide a greater bend in the leads extending therethrough.

4. Apparatus for bending and cutting parallel rows of leads of an electrical component extending through parallel rows of a printed circuit board including;

a shear plate having parallel rows of apertures to receive therethrough the free ends of leads extending through a printed circuit board;

a pair of shear blocks adjacent the face of the shear plate remote from the printed circuit board;

spring means to bias the shear blocks to a rest position between the rows of apertures of said shear plate and means to reciprocate said shear blocks outwardly from their rest position against the bias of said spring means so that each said shear block will first contact, then bend and then cut the rows of leads extending through said shear plate so as to attach the electrical component to the printed circuit board.

5. The apparatus as set forth in claim 4 wherein preselected apertures of said shear plate are enlarged with respect to the remainder of the apertures whereby the preselected leads extending through said preselected apertures will be bent to a greater degree than the remainder of the leads due to being bent around the apertures of the printed circuit board by the movement of the shear blocks prior to cutting.

6. The apparatus as set forth in claim 4 wherein preselected apertures of said shear plate are angled with respect to the remainder of the apertures whereby the preselected leads extending through said preselected apertures will be bent to a greater degree that the remainder of the leads due to being bent around the apertures of the printed circuit board by the movement of the shear blocks prior to cutting.

* * * * *